United States Patent [19]

Cukier et al.

[11] Patent Number: 4,897,856
[45] Date of Patent: Jan. 30, 1990

[54] OFFSET CORRECTION CIRCUIT FOR A SIGMA-DELTA CODING DEVICE

[75] Inventors: Maurice Cukier, Cagnes Sur Mer; Frederic Marciano, Biot; Patrick Michel, La Gaude, all of France

[73] Assignee: International Business Machines, Armonk, N.Y.

[21] Appl. No.: 254,632

[22] Filed: Oct. 7, 1988

[30] Foreign Application Priority Data

Oct. 19, 1987 [EP] European Pat. Off. ........ 87480015.4

[51] Int. Cl.$^4$ ........................................... H04B 14/04
[52] U.S. Cl. ...................................... 375/28; 375/27; 341/143
[58] Field of Search ............... 375/27, 95, 28, 30; 341/143

[56] References Cited

U.S. PATENT DOCUMENTS 4,039,955  8/1977  Eggermont et al. ................. 375/28
4,209,773  6/1980  Everard ............................. 340/347
4,528,551  7/1985  Agrawal et al. .................... 375/27

FOREIGN PATENT DOCUMENTS 2077539  6/1981  United Kingdom .

Primary Examiner—Benedict V. Safourek
Assistant Examiner—T. Salindong
Attorney, Agent, or Firm—Edward H. Duffield

[57] ABSTRACT

An offset correction circuit is disclosed in a digital-to-analog coder (10) comprising a delta coder (18) providing a serial bit string at a high frequency F in response to digital words supplied at a low frequency F, and an analog integrator (22) providing an analog output signal (24) which is an analog representation of the digital words. The offset correction circuit avoids introducing an offset in the analog output of the integrator (22) when a PLO correction is taken to slow down or to speed up the clock controlling the input of the digital words. Such a circuit is implemented by a state generator which provides a corrected pulse in place of the sigma-delta data which lasts half the duration of the offset.

10 Claims, 5 Drawing Sheets

OFFSET CORRECTION CIRCUIT FOR A SIGMA-DELTA CODING DEVICE

FIELD OF THE INVENTION

The invention relates to digital-to-analog converting devices, and more particularly an offset correction circuit for a sigma-delta coding device used in data transmission in the form of analog signals over the telephone lines.

PRIOR ART

In data transmission systems wherein data are transmitted as analog signals over telephone lines, the digital data to be conveyed are generally represented by modulation states of a carrier signal. The carrier signal is modulated by a modulator at the transmission end and demodulated by a demodulator at the reception end, the modulator/demodulator assembly being called a modem.

In the present-day state of the art modems, all of the modulation processing is performed digitally under the control of a signal processor. The digital samples of the modulated carrier have then to be converted into analog form in order to be transmitted over analog telephone lines. This conversion function is generally carried out in a digital-to-analog converter (DAC), such a converter being based, for instance, upon a successive approximation technique. But, there is a trend to replace this type of converter by sigma-delta converters which enable analog components to be replaced by digital equivalents suitable for VLSI implementation.

In sigma-delta techniques, the digital data signals transmitted from the data terminal Equipment (DTE) are sampled synchronously with the transmit clock located in the DTE. The frequency of this transmit clock can be different from the base frequency of the crystal oscillator which provides all the frequencies needed in the modem, generally, a Phase Lock Oscillator (PLO) is used to track the current transmit clock so as to adjust the sampling frequency by simply slowing down or speeding up the sampling clock when necessary.

While the PLO corrections do not impact the operation of the classical digital-to-analog converters, they entail an offset in the analog output of the sigma-delta converters. Indeed, a sigma-delta converter is composed of two parts, a digital coder which produces a continuous string of bits at a high frequency in response to digital input words provided to a low frequency, and an analog integrator providing the analog signal in response to the string of bits. When a PLO correction occurs by slowing down or speeding up the sampling frequency at which are provided the digital words to the digital coder, the duration of one bit of the continuous string of bits produced at the output of the coder is lengthened or shortened, resulting in an offset at the output of the analog integrator.

OBJECT OF INVENTION

Therefore, the object of the invention is to provide an offset correction circuit which avoids introducing an offset in the analog output of a digital-to-analog coder when a PLO correction is taken to slow down or to speed up the clock controlling the input of the digital words into the sigma-delta converter.

SUMMARY

The offset correction circuit according to the invention is used with a digital-to-analog coder. It comprises a delta coder providing a serial bit string at a rate provided by a clock at a frequency F in response to digital words supplied to the coder at a rate provided by a clock at a frequency f which is low with respect to frequency F, and an analog integrator providing an analog output signal which is an analog representation of the digital words. It further comprises a time modifying means which lengthens or shortens by a predefined duration the time of one bit provided by the delta coder in response to an adjust signal which respectively slows down or speeds up the clock at a frequency F. And the correction circuit further comprises correction means which produces a corrected pulse in place of the sigma-delta data provided by the delta coder in response to the detection of the fact that one bit has been lengthened or shortened, thereby introducing an offset having respectively the same polarity as or the inverse polarity of the polarity of the lengthened or shortened bit, with the corrected pulse lasting half the predefined duration and being generated as soon as the sigma-delta data polarity equals the polarity of the offset. The corrected pulse is of the same polarity as the detected bit when this one bit has been shortened, and the inverse polarity of the detected bit when this one bit has been lengthened.

The details of a preferred embodiment of the invention may be readily understood from the following detailed description when read in conjunction with the accompanying drawings wherein:

DETAILED DESCRIPTION

Figure 1:
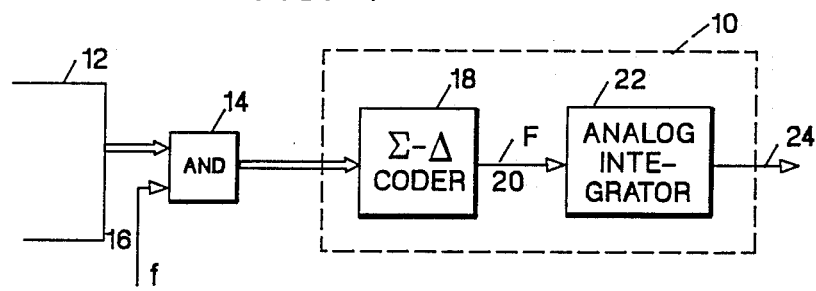
FIG. 1 is a schematic diagram of a conventional sigma-delta converter.

In reference to FIG. 1, digital words are received at the input of sigma-delta converter 10. Such words are generally PCM words, each representing a sample of a data signal to be transmitted over a telephone network. They can be obtained from the processing by signal processor 12 of data bit streams provided by a data terminal equipment DTE (not shown). The signal processor 12 may be part of a data terminating-circuit equipment DCE such as a modem. The processing may be after modulation with a carrier frequency or not according to whether the transmission is of the carrier band type or base-band type. It is assumed that the words include 16 bits, but this is not a significant feature for the invention.

The words are provided to sigma-delta converter 10 by means of and circuit 14 which is enabled by pulses provided at frequency f on input 16 which can be, as an example, equal to 14.400 Hz. In converter 10, the words are first coded into a continuous string of bits by sigma-delta coder (or simply "delta coder") 18, produced on line 20 at a high frequency F. With f=14.4 kHz, F can be equal to 864 khz which is an integral multiple of 14.4 khz. Then, this string of bits is used as input to analog integrator 22, which provides the analog signal on the output 24. It must be noted that, in the analog integrator 22, a 1 bit corresponds to a positive voltage and a 0 bit corresponds to a negative voltage.

Sigma-delta converter 10 is not a part of the invention, and therefore, it will not be described in detail here, as far as the operation of the components coder and analog integrator, is concerned. A description of the well-known sigma-delta converter which could be used in the invention can be found in the Article "A unity bit coding method by negative feedback" published in Proceedings IEEE, vol. 51, pages 1524-1535, November 1963, and in the article "A Use of Double integration in sigma-delta modulation" published in IEEE Trans. Comm., vol. COM-34, pages 72-76, January 1986.

The clocks providing frequencies f and F are generally generated from a single clock which provides all the frequencies needed in the modem. This single clock is derived from a crystal oscillator. In the present example, such a modem clock can have a frequency of 2,592 MHz, which is divided by 3 to provide the 864 kHz sigma-delta clock and divided by 180 to generate the 14.4 kHz PCM sampling clock.

In synchronous modems, transmitted signals are sampled synchronously with the transmit clock which is located in the DTE transmitting the digital data to the modem. Therefore, the transmit clock frequency can be slightly different from the one generated by the modem crystal oscillator. This is why a phase lock oscillator (PLO) is used to track the correct transmit clock. The PLO correction simply adds or subtracts one crystal oscillator period to the PCM sampling clock which is, in the example, at the frequency 14.4 kHz. Of course, the sigma-delta clock at frequency F (here, F is equal to 864 kHz) is also affected by PLO corrections in order to remain synchronous with the PCM sampling clock.

First it must be noted that during each period of the sigma-delta clock at 864 kHz, there are three periods of the crystal oscillator at 2,592 kHz. Only two of these three periods are used for the operation of sigma-delta coder 18 of FIG. 1, the third period being idle or no-operation. Therefore, such a no-operation period can be used to synchronize the sigma-delta clock as explained hereafter in reference to FIGS. 2, 3 and 4.

Figure 2:
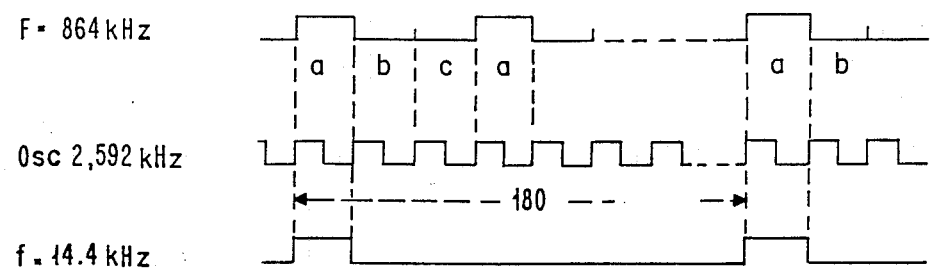
FIGS. 2, 3 and 4 are time diagrams showing the relationship between pulses provided by the crystal oscillator, the PCM sampling clock and the sigma-delta clock in the three cases in which the PCM sampling clock is respectively synchronous, slow or fast with respect to the crystal oscillator.

When the PCM sampling clock at 14.4 kHz is synchronized with the crystal oscillator, two pulses of the PCM sampling clock are exactly separated by 180 oscillator cycles as shown on FIG. 2. Each period of the sigma-delta coder clock at frequency F=864 kHz lasts three cycles of the crystal oscillator at 2,592 kHz, noted a, b, c in FIG. 2.

Figure 3:
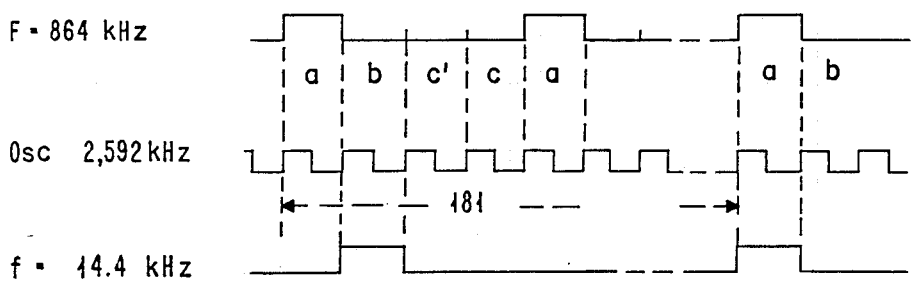

Assuming that, due to the PLO correction, the PCM sampling clock has been slowed down (when the external transmit clock is slower than the modem crystal oscillator), the pulse of the PCM sampling clock occurs at a cycle of the crystal oscillator which corresponds to "b" in the period of the sigma-delta clock, as shown on FIG. 3. In this cae, the correction consists in adding an extra no-operation cycle "c" to the next period of the sigma-delta clock. Therefore, the next PCM sampling clock pulse occurs at a cycle "a". Note that the cycle "a" is separated from the preceding one by 181 cycles.

Figure 4:
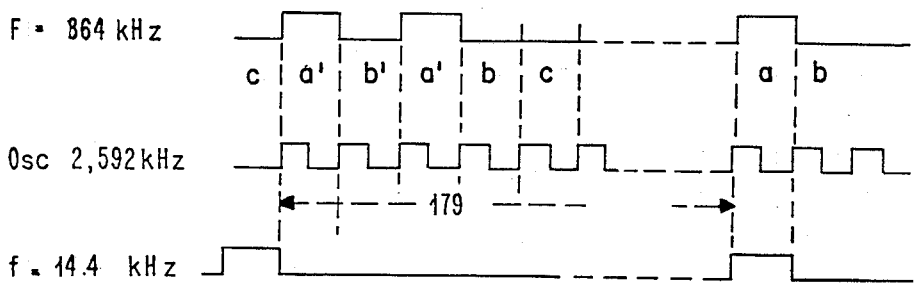

Next, it is assumed that the PCM sampling clock has been sped up due to a PLO correction (when the external transmit clock is faster than the modem crystal oscillator). The pulse of the PCM sampling clock occurs at a cycle of the crystal oscillator which corresponds to "c" in the period of the sigma-delta clock, as shown in FIG. 4. Then the next no-operation cycle "c" is skipped, resulting in a period of the sigma-delta clock which lasts only cycles a' and b'. Therefore the next PCM sampling clock pulse occurs at a cycle "a", which is separated from the preceding cycle by 179 cycles of the crystal oscillator.

Though no circuit is shown for enabling the sigma-delta clock to be slowed down or sped up in response to PLO actions acting on the PCM clock, the implementation of such a circuit is easily within the skill of a person skilled in the art with the help of FIGS. 2, 3 and 4 and the description thereof.

It must be noted that the PCM sampling clock frequency can be different from 14.4 kHz insofar as f is a submultiple of the sigma-delta clock frequency F. For example, with F=864 kHz, frequency f could have been equal to 9.6 kHz or 28.8 kHz. it is also possible to have the PCM words provided by signal processor 12 at frequency 14.4 kHz whereas they are fed to sigma-delta coder at frequency f=28.8 kHz, each PCM word being held during two cycles of clock f. Of course, with a frequency f=28.8 kHz, two pulses of the PCM sampling clock are separated by 90 oscillator cycles when the latter clock is synchronized with the crystal oscillator, instead of 180 cycles as shown on FIG. 2. Likewise, the pulse of the PCM sampling clock is separated from the preceding one by 91 oscillator cycles instead of 181 in case of slow down (FIG. 2), and separated from the preceding one by 89 cycles instead of 179 in case of speed up (FIG. 3).

Now, in reference to FIG. 1, the bits which an provided at frequency F by sigma-delta coder 18, are first converted to a positive voltage for a 1 bit and a negative voltage for a 0 bit before being integrated in analog integrator 22. Assuming that a slow down PLO correction has occurred, it causes a bit to last four oscillator cycles instead of three cycles, as seen on FIG. 3. Such a longer sigma-delta bit results in an offset having the same polarity as the sigma-delta data, that is a positive voltage when the longer bit is a 1 bit, and a negative voltage when the longer bit is a 0 bit. Likewise, when a speed up PLO correction has occurred, it causes a bit to last two oscillator cycles instead of three cycles, as seen on FIG. 4. This shortened bit results in an offset having the inverse polarity of the sigma-delta data, that is a negative voltage when the bit affected is a 1 bit, and a positive voltage when this bit a 0 bit.

The essential feature of the invention consists in compensating the offset introduced by the PLO correction by a correction pulse replacing the sigma-delta data. As the offset lasts the duration by which a bit provided by the sigma-delta coder has been lengthened or shortened, the correction pulse lasts half this duration. In the present example where the PLO correction is one oscillator cycle of the 2,592 kHz clock, the correction pulse must last half an oscillator cycle, which corresponds to a period of clock at a frequency 2F=5,184 kHz. The correction pulse must be of the inverse polarity of the offset, that is the same polarity as the shortened bit in case of speed up PLO action, and the inverse polarity of the lengthened bit in case of slow down PLO action. Such a correction pulse can be generated as soon as the polarity of the delta-sigma data equals the polarity of the offset.

Figure 5:
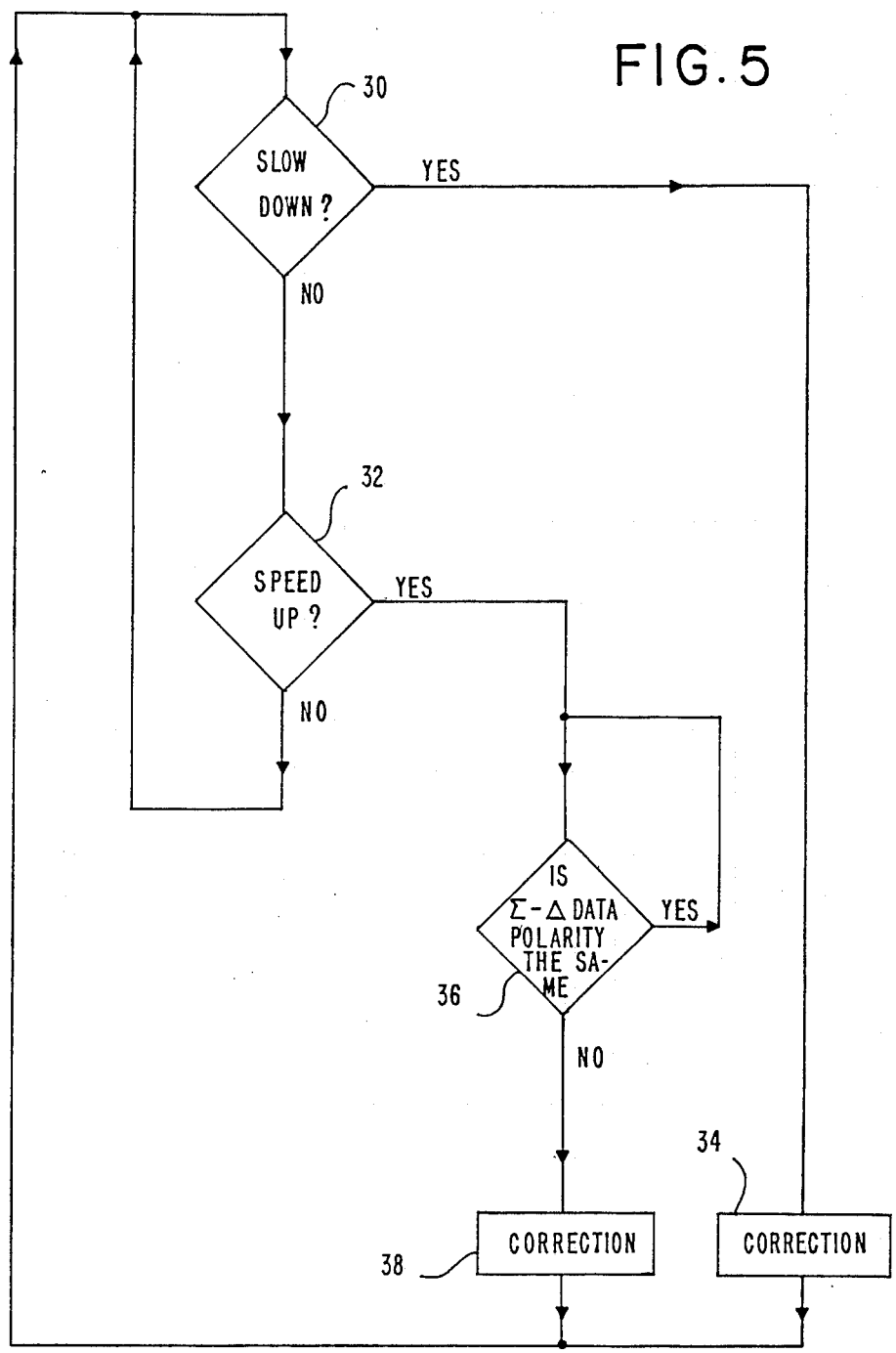
FIG. 5 is a simplified process flow chart (organigram) describing the steps performed for producing a corrected pulse in response to a PLO slow down or speed up action.

The organigram of the decisions to be taken is described on FIG. 5. As shown by blocks 30 and 32, the system is continually monitored to determine whether a PLO slow down action or a PLO speed up action has been performed. In most cases, the transmit clock being synchronized with the crystal oscillator, no action is taken, and the sequence of blocks 30 and 32 is repeated.

When a PLO slow-down action occurs, that means a correction pulse having the inverse polarity of the sigma-delta bit must be generated for replacing the sigma-delta data during a time interval of half the PLO correction. Such a correction pulse can therefore be generated during the current sigma-delta bit, especially since this bit is lengthened by the PLO correction as seen above. Accordingly, the organigram of FIG. 5 goes from block 30 directly to correction block 34 where a correction pulse of the inverse polarity of the current bit is generated as explained above. Then, the organigram returns to the beginning.

When a PLO speed up action occurs (the answer to block 32 is yes), that means that a correction pulse of the same polarity as the sigma-delta bit, shortened in this case, must be generated for replacing the sigma-delta during a time interval of half the PLO correction. Therefore, such a correction pulse cannot be generated during the current sigma-delta bit, and during the following bits as long as these bits have the same polarity as the current bit during which the PLO action has been detected. Accordingly, the organigram goes to block 36 to determine whether the sigma-delta bit which follows the current bit has the same polarity. If so, this condition is checked again until a subsequent bit has the inverse polarity. In this case, the correction pulse of block 38, which is different from the correction pulse of block 34 (same polarity as the current bit), can be generated. Then, the organigram returns to the beginning.

All the decisions blocks of the organigram shown on FIG. 5 can be implemented either in hardwired logic, or in software. In the latter case, it is the signal processor 12 of FIG. 1 which executes a program implementing the organigram blocks. Such a program can be easily built from the organigram of FIG. 5, and will not be described in the present description.

Figure 6:
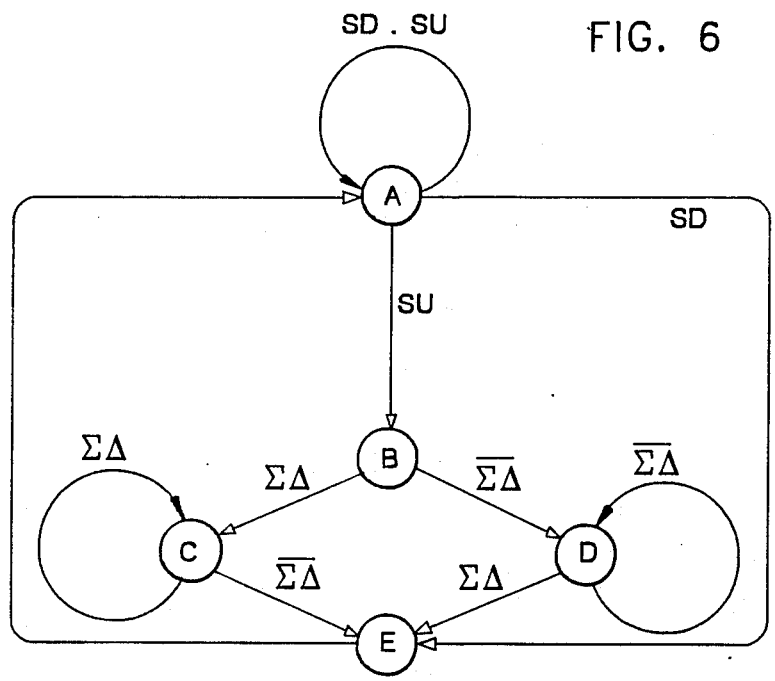
FIG. 6 is a simplified process chart (organigram) describing the states of a state generator implementing the invention.

An implementation of the invention in hardwired logic is also possible by using a state generator as shown on FIG. 6. As long as there are no PLO slow down (SD) or speed up (SU) actions which are taken, state A is maintained. This is shown on the Figure by the curved arrow referenced $\overline{SD}.\overline{SU}$ indicating that the slow down (SD) and speed up (SU) inputs are not activated. When a speed up action is taken, the system goes from state A to state B at the following crystal oscillator pulse. Then, the system goes either to state C or to state D according to whether the sigma-delta bit is a 1 or a 0 bit. As shown in the FIG. 6 by the curved arrows, state C (or state D) is maintained as long as the subsequent sigma-delta bits are 1 bits (or 0 bits). As soon as the polarity of the sigma-delta data changes, the state is changed from C to E (or from D to E). State E means that the correction pulse can be generated. Then, the system comes back to state A awaiting a new PLO correction. It must be noted that when a PLO slow-down action is taken, the system goes directly from state A to state E where a correction pulse is generated, as explained above.

The five states necessary in the state generator require that three variables be used in the logic circuit. These three variables $Q_0 \ Q_1 \ Q_2$ can take the following values when associated with the different states.

|   |   | $Q_0$ | $Q_1$ | $Q_2$ |
|---|---|---|---|---|
| A | → | 0 | 0 | 0 |
| B | → | 0 | 0 | 1 |
| C | →. | 0 | 1 | 1 |
| D | → | 0 | 1 | 0 |
| E | → | 1 | 0 | 0 |

Figure 7:
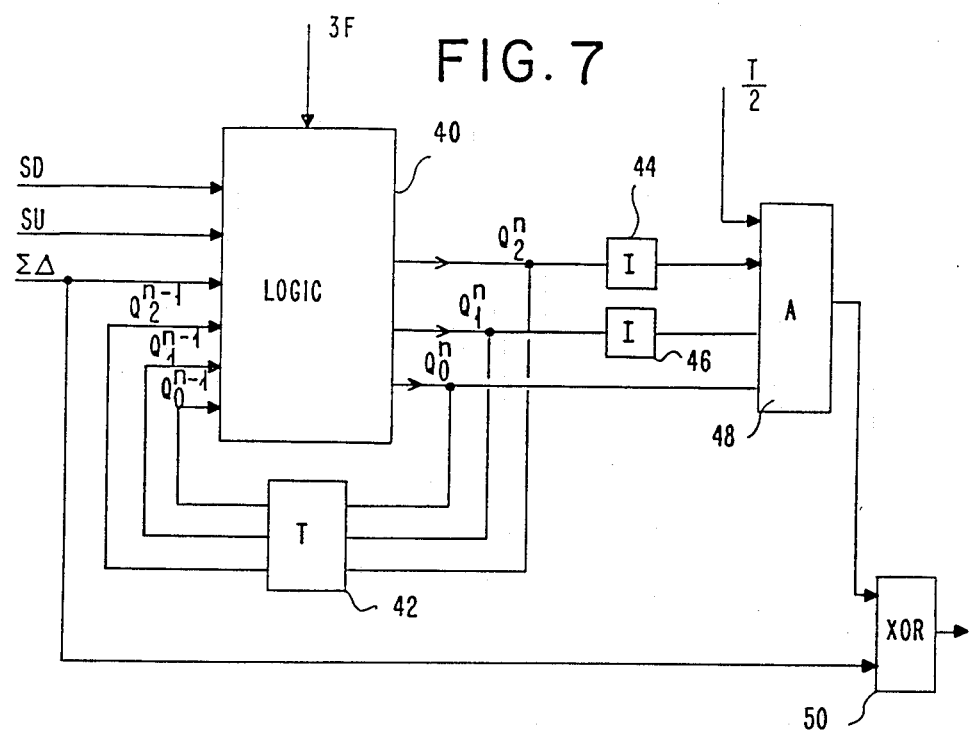
FIG. 7 is a schematic diagram of a state generator implementing the invention.
Figure 8:
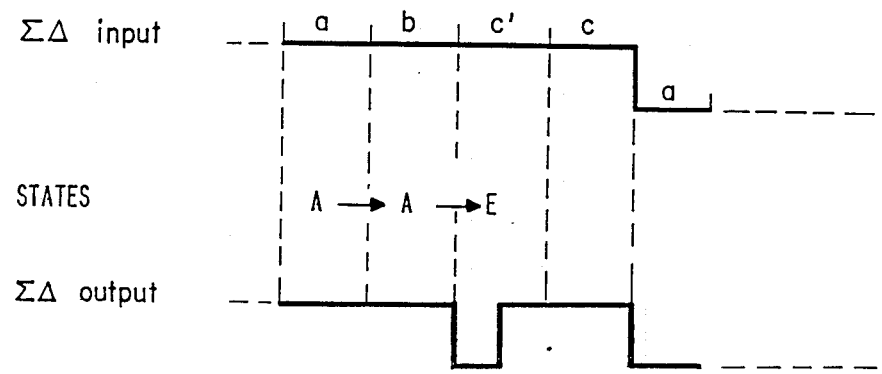
FIGS. 8, 9 and 10 are time diagrams showing the input sigma-delta data, the output sigma-delta data after correction and the corresponding states of the state generator of FIG. 7, respectively in case of slow down, speed up with a positive polarity and speed up with a negative polarity.
Figure 9:
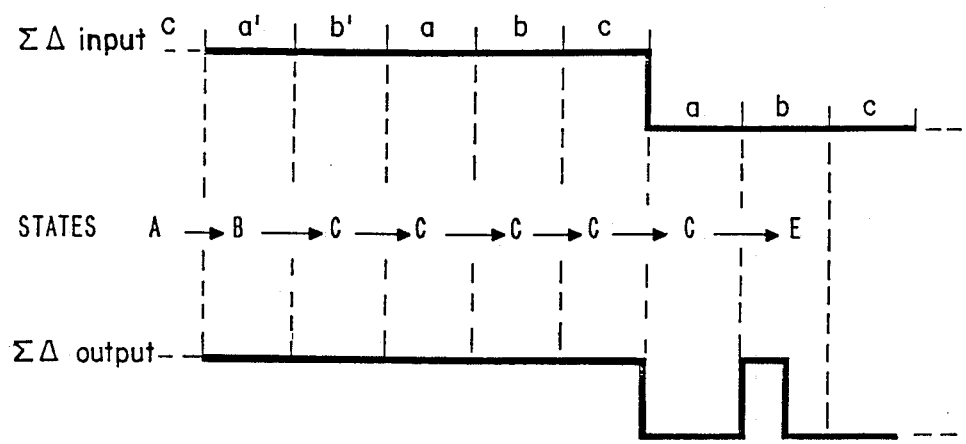

The implementation of the state generator is now described in reference to FIG. 7. Logic circuit 40 provides as outputs the three variables $Q_0 \ Q_1 \ Q_2$ at each pulse of the crystal oscillator, here at frequency 3F=2,592 kHz. The variables are referenced $Q_0^n \ Q_1^n \ Q_2^n$ at the instant n. Logic 40 receives as inputs: line SD activated when a PLO slow down action is detected, line SU activated value a PLO speed up action is detected, line SW for the sigma-delta data, and the three variables $Q_0 Q_1 Q_2$ which have been delayed by an oscillator cycle T in delay circuit 42. They are referenced $Q_0^{n-1} \ Q_1^{n-1} \ Q_2^{n-1}$ at the instant n.

Since the correction pulse must be generated when the state E is defined by 100 for the three variables $Q_0 \ Q_1 \ Q_2$, the two outputs $Q_1^n$ and $Q_2^n$ are inverted by inversion circuits 44 and 46. Then, $Q_0^n$, $\overline{Q_1^n}$ and $\overline{Q_2^n}$ are ANDed in AND circuit 48. The output of AND circuit 48 is used to invert the SW data in XOR circuit 50. Note that AND circuit 48 is enabled only during half a cycle T/2 of the oscillator resulting in the inversion of the sigma-delta data by XOR circuit 50 also during T/2 (T being the predefined duration used for shortening or lengthening a cycle of the sigma-delta clock when a PLO correction occurs).

To comply with the state generator shown in FIG. 6, logic circuit 40 is determined easily by a method which will not be explained since it is not an essential feature of the invention. With the logic function AND represented by "." and the logic function OR represented by "+", the outputs $Q_0^n$, $Q_1^n$ and $Q_2^n$ are obtained as follows with respect to the inputs SD, SU and, and $Q_0^{n-1}$, $Q_1^{n-1}$ and $Q_2^{n-1}$:

$$Q_0^n = \overline{\Sigma \Delta} \cdot \overline{Q_1}^{n-1} \cdot \overline{Q_2}^{n-1} + \Sigma \Delta \cdot Q_1^{n-1} \overline{Q_2}^{n-1} + SD \cdot \overline{Q}_0^{n-1} \cdot \overline{Q_1}^{n-1} \cdot \overline{Q_2}^{n-1}$$

$$Q_1^n = \overline{Q_1}^{n-1} \cdot Q_2^{n-1} + \overline{\Sigma \Delta} \cdot Q_1^{n-1} \cdot \overline{Q_2}^{n-1} + \Sigma \Delta \cdot Q_2^{n-1}$$

$$Q_2^{n-1} = \Sigma \Delta \cdot Q_2 + SU \overline{Q_0}^{n-1} \cdot \overline{Q_1}^{n-1} \cdot \overline{Q_2}^{n-1}$$

For a better understanding of the implementation of the invention by the state generator of FIGS. 6 and 7, FIGS. 8, 9 and 10 depict time diagrams showing the occurrence of the correction pulse in case of slow down or speed up actions.

Assuming that the PCM sampling clock has been slowed down, the pulse of this clock occurs at a cycle "b" of the crystal oscillator (see FIG. 3). As shown on FIG. 8, the state generator is in state A during cycle "a", and also during cycle "b" during which the slow down action is taken (signal SD is high). Then, the next state is state E (see FIG. 6) during which the correction pulse is provided. Note that, in the example of FIG. 8 where the sigma-delta data is positive, the correction is a negative pulse which lasts half the cycle "c'". Though this pulse is shown in the first half, it could have been in the second half of the cycle, such an alternative being of no importance for the invention.

Assuming that the PCM sampling clock has been sped up, the pulse of the clock occurs at a cycle "c" of the crystal oscillation (see FIG. 4). As shown on FIGS. 9 and 10, the state generator is in state A during cycle c. Then, after detection of the speed up action (signal SU is high), the generator goes to state B (see FIG. 6). If the sigma-delta data is positive as in FIG. 9, the next states are states c until the cycle "a" of the first negative sigma-delta bit. At cycle "b", the state changes from C to E, and a positive corrected pulse is produced to compensate the negative offset due to the missing cycle "c".

Figure 10:
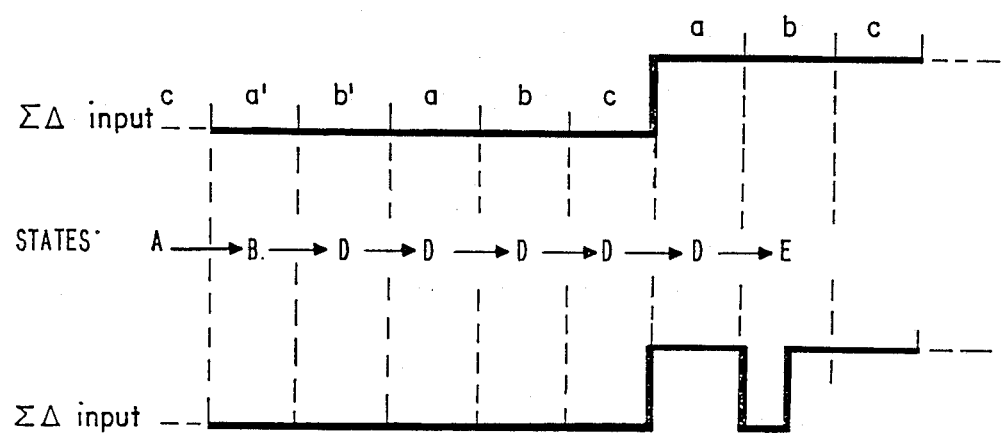

With a negative sigma-delta data as in FIG. 10, states after state B are states D as long as the data is negative, and also during the cycle "a" of the first positive bit. At cycle "b", the state changes from D to E, and a negative corrected pulse is produced to compensate the positive offset due to the missing cycle "c".

We claim:

1. An offset correction circuit in a digital-to-analog coder (10) comprising a delta coder (18) providing a serial bit string at a rate provided by a clock at a frequency F in response to digital words supplied at a rate provided by a clock at a frequency f which is low with respect to said frequency F, and an analog integrator (22) providing an analog output signal (24) which is an analog representation of said digital words; said circuit being characterized in that it comprises:
   time modifying means which lengthens or shortens by a predefined duration the time of one bit provided by said delta coder in response to an adjust signal which respectively slows down or speeds up said clock at a frequency f; and
   correction means (FIG. 7) which produces a corrected pulse in place of the sigma-delta data provided by said delta coder in response to the detection that one bit has been lengthened or shortened thereby introducing an offset having respectively the same polarity as or the inverse polarity of the polarity of the lengthened or shortened bit, with said corrected pulse lasting half the predefined pulse duration and being generated as soon as the sigma-delta data polarity equals the polarity of said offset, and being of the same polarity as said detected bit when this one bit has been shortened and the inverse polarity of said detected bit when this one bit has been lengthened.

2. The offset correction circuit according to claim 1 wherein:
   frequencies f and F are derived from a signal at a base frequency provided by an oscillator, said predefined duration being a period of said signal at a base frequency.

3. The offset correction circuit according to claim 2 wherein:
   said delta coder provides a serial bit string at a rate provided by a clock frequency F=864 kHz derived from a signal at a base frequency 3F=2,592 kHz provided by said oscillator, with each bit output from said delta coder lasting three periods of said signal at 2,592 kHz in the absence of said adjust signal, whereby one bit lasts four periods of said signal at 2,592 kHz when lengthened and two periods when shortened, in response to said adjust signal which respectively slows down or speeds up said the clock at frequency F=864 kHz.

4. The offset correction circuit according to claim 1, 2 or 3 wherein:
   said correction circuit means is a state generator comprising a logic circuit (40) which provides output signals representative of the state taken by said state generator at time $t_n$ in response to: signals indicative of the detection that one bit of sigma-delta data string provided by said delta coder (18) has been lengthened or shorten; in response to the value of the sigma-delta data at time $t_n$; and in response to the output signals representative of the state taken by said generator at time $t_{n-1}$.

5. The offset correction circuit according to claim 4 wherein:
   the corrected pulse provided by said state generator (FIG. 7) is used as input to a XOR circuit (50) to invert the sigma-delta data.

6. A modem comprising a sigma-delta converter incorporating the offset correction circuit according to any one of claims 1 to 3 wherein said digital words are samples of the modulated signal to be converted into the analog form, and said adjust signal is provided in response to a PLO action when the oscillator included in said modem provides a signal at a base frequency which is fast or slow with respect to the clock used for the transmission of the digital data in the DTE.

7. A modem comprising a sigma-delta converter incorporating the offset correction circuit according to claim 4 wherein said digital words are samples of the modulated signal to be converted into the analog form, and said adjust signal is provided in response to a PLO action when the oscillator included in said modem provides a signal at a base frequency which is fast or slow with respect to the clock used for the transmission of the digital data in the DTE.

8. A modem comprising a sigma-delta converter incorporating the offset correction circuit according to claim 5 wherein said digital words are samples of the modulated signal to be converted into the analog form, and said adjust signal is provided in response to a PLO action when the oscillator included in said modem provides a signal at a base frequency which is fast or slow with respect to the clock used for the transmission of the digital data in the DTE.

9. An offset correction method in a digital-to-analog coder (10) comprising a delta coder (18) providing a serial bit string at a rate provided by a clock at a frequency F in response to digital words supplied at rate provided by a clock at a frequency f which is low with respect to said frequency F, and an analog integrator (22) providing an analog output signal (24) which is an analog representation of said digital words; said method being characterized in that it comprises the steps of:
   lengthening or shortening by a predefined duration the time of one bit provided by said delta coder, said lengthening or shortening being in response to an adjust signal which respectively slows down or speeds up said clock at a frequency f; and
   producing a corrected pulse in place of the sigma-delta data provided by said delta coder in response to the detection that one bit has been lengthened or shortened thereby introducing an offset having, respectively, the same polarity as or the inverse polarity of the polarity of the lengthened or shortened bit, with said corrected pulse lasting half the predefined bit duration and being generated as soon as the sigma-delta data polarity equals the polarity of said offset, and being of the same polarity as said detected bit when this one has been shortened and the inverse polarity of said detected bit when this one has been lengthened.

10. The offset correction method according to claim 9 wherein said step of producing a corrected pulse comprises the steps of:
    detecting the occurrence of an adjust signal of slowing down said clock at frequency f, and if so, producing said corrected pulse, and
    detecting, in the absence of a slowing down adjust signal, the occurrence of an adjust signal of speeding up said clock at frequency f, and if so, producing said corrected pulse only when the polarity of said sigma-delta data changes.

* * * * *